United States Patent [19]
Yanai et al.

[11] Patent Number: 5,202,857
[45] Date of Patent: Apr. 13, 1993

[54] SYSTEM FOR GENERATING MEMORY TIMING AND REDUCING MEMORY ACCESS TIME

[75] Inventors: Moshe Yanai, Framingham; Natan Vishlitzky, Brookline; Bruno Alterescu, Newton; Daniel Castel, Framingham, all of Mass.

[73] Assignee: EMC Corporation, Hopkington, Mass.

[21] Appl. No.: 610,424

[22] Filed: Nov. 7, 1990

[51] Int. Cl.⁵ ............................................. G11C 8/04
[52] U.S. Cl. ..................................... 365/233; 365/52; 365/63; 365/230.03; 365/239
[58] Field of Search .................. 365/233, 230.03, 52, 365/63, 239

[56] References Cited

U.S. PATENT DOCUMENTS

| | | | |
|---|---|---|---|
| 4,663,735 | 5/1987 | Novak et al. | 365/233 |
| 4,785,428 | 11/1988 | Bajwa et al. | 365/233 |
| 4,933,910 | 6/1990 | Olson et al. | 365/233 |
| 4,953,131 | 8/1990 | Purdham et al. | 365/233 |
| 5,036,493 | 7/1991 | Nielsen | 365/230.03 |
| 5,042,013 | 8/1991 | Sato | 365/233 |
| 5,043,947 | 8/1991 | Oshima et al. | 365/230.03 |

Primary Examiner—Joseph E. Clawson, Jr.
Attorney, Agent, or Firm—Weingarten, Schurgin, Gagnebin & Hayes

[57] ABSTRACT

A system for generating memory timing signals and for reducing memory access time includes a plurality of memory modules having an array of memory cells addressable in response to a number of row address select and column address select signals. A row address select signal generator associated with each memory module generates row address signals upon the system receiving a request for access to any memory storage location. At least one memory array selection comparator compares memory address signals with preselected, unique, memory module addresses, for identifying a selected memory module, and for providing a column address signal generator enable signal to the column address select signal generator of the selected memory module. The row address select timing signals enable one or more row address select signals to each memory module prior to the time that the at least one memory array selection comparator identifies the selected memory module and provides the column address select signal generator enable signal to the associated column address signal generator of the selected memory array.

4 Claims, 3 Drawing Sheets

SYSTEM FOR GENERATING MEMORY TIMING AND REDUCING MEMORY ACCESS TIME

FIELD OF THE INVENTION

This invention relates to computer systems and more particularly, to memory systems.

BACKGROUND OF THE INVENTION

Advances in semiconductor technology are now providing computer systems with ever increasing amounts of semiconductor memory storage. Such additional memory must be easily controllable and accessable on a timely basis so as not to impact the performance of the computer system.

Circuitry utilized to control the memory and generate memory timing signals has traditionally been centralized to minimize the amount of circuitry or hardware required. A centralized approach to providing memory timing, however, is accompanied by the problems of timing signal skew and signal delays, as the timing signals travel from the centralized controller to the various memory boards, and from memory board to memory board.

In addition to memory timing considerations, access to increasing amounts of semiconductor memory presents the additional problem of being able to decode a larger number of memory address lines necessary to address the increasing amounts of memory storage within a sufficiently short period of time so as not to seriously degrade system performance.

SUMMARY OF THE INVENTION

This invention features a system for generating memory timing signals for reducing memory access time. Reduction in memory access time is achieved by issuing a row address select signal to each of a plurality of memory modules in response to a memory initiate signal and a clock signal. The row address select signal is issued prior to the time that a one memory module is selected and receives a column address select signal for addressing one or more memory cells.

Thus, in accordance with the present invention, one embodiment includes a plurality of memory modules, each memory module including an array of memory cells operative for storing data. Each memory cell is addressable in response to at least one or more row address select signals and one or more column address select signals.

Associated with each memory module is a row address select signal generator which is responsive to a plurality of memory address signals and at least one row address select timing signal, for providing the one or more row address select signals to each of the memory modules. Each memory module also includes an associated column address select signal generator, responsive to a plurality of memory address signals, at least one column address select timing signal and one column address signal generator enable signal, for providing the one or more column address select signals to the selected memory module.

The system also includes at least one memory array selection comparator, for comparing a plurality of memory address signals with at least one preselected, unique memory module address. Upon the equivalence of the plurality of memory address signals and the unique memory module address, the comparator identifies a selected memory module and provides the enable signal to the selected memory module.

At least one memory timing generator is provided, which is responsive to at least one memory cycle initiate signal and to a clock signal, for providing the row address select and column address select timing signals. The row address select timing signal is operative for enabling the row address select signal generator associated with each of the plurality of memory modules to generate a row address select signal prior to the time that the at least one memory array selection comparator identifies the selected memory module and provides the column address select signal generator enable to the column address select signal generator associated with the selected memory array.

DESCRIPTION OF THE DRAWINGS

These, and other features of the present invention will be better understood by reading the following detailed description taken together with the accompanying drawings, wherein.

DETAILED DESCRIPTION OF THE INVENTION

Figure 1:
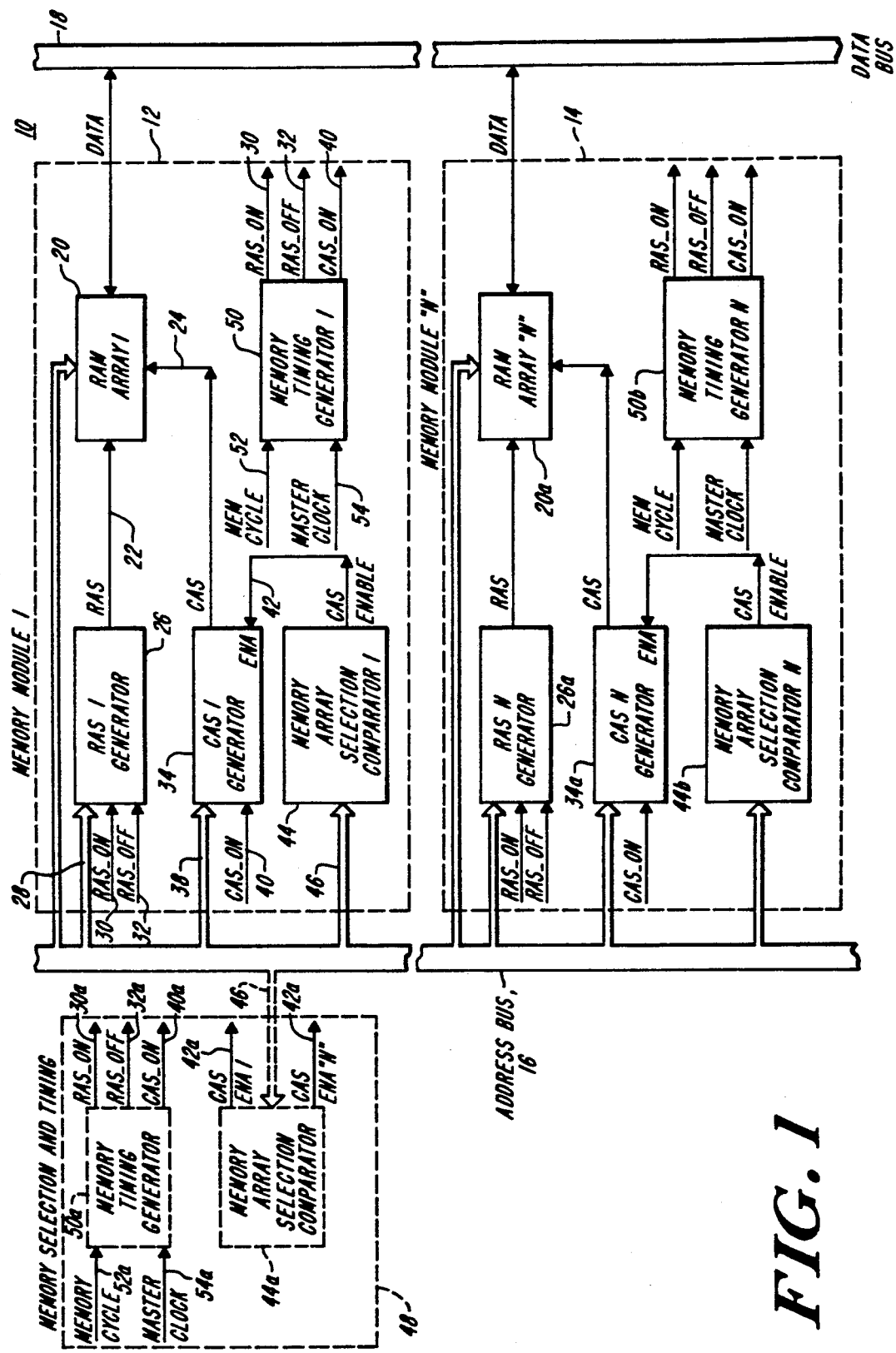
FIG. 1 is a block diagram illustrating the system for generating memory timing and reducing memory access time of the present invention.

The system for generating memory timing and reducing memory access time 10, FIG. 1, according to the present invention includes a plurality of memory modules such as memory modules 12 and 14 coupled to a system such as a host (not shown) by means of at least an address bus 16 and data bus 18. The bus width, band width, and other attributes of address bus 16 and data bus 18 are variable based upon the system in with which the present invention is utilized as is well known to those skilled in the art.

Each memory module such as memory module 12, includes an array 20 of memory cells. The array of memory cells 20 are typically an array of dynamic random access memory cells (DRAM) arranged as required by the system as well known in the art. Such dynamic random access memory cells which comprise the array of memory cells 20 are generally addressable under control of at least one or more row address select signals 22, and one or more column address select signal 24. Further, such dynamic random access memory cell specifications typically require that the row address select signal (RAS) 22, be asserted for a predetermined period of time prior to asserting the column address select signal 24.

Row address select signal 22 is provided by row address select signal generator 26 in response to a plurality of memory address signals 28 from memory address bus 16. Additionally, row address select signal generator 26 is also responsive to one or more row address select generator timing signals 30 and 32 provided by a memory timing generator which will be discussed in greater detail below.

Column address select signal generator 34 provides column address select signal 24 in response to a plurality of memory address signals 38 from memory address bus 16. Column address select signal generator 34 is also responsive to one or more timing signals 40 as well as enable signal 42. In one embodiment, enable signal 42 is provided by an associated memory array selection comparator 44 located on memory module 12. Memory array selection comparator 44 includes a preselected, unique memory module address, and is operative for comparing a plurality of memory address signals 46 with the preselected, unique memory module address, for identifying a selected memory module from among the plurality of memory modules in the system. If the plurality of memory address signals 46 are equivalent to the preselected, unique memory address stored within the memory array selection comparator 44, the comparator then provides column address select enable signal 42 to the associated column address select signal generator 34.

In one embodiment, the memory array selection comparator 44a may be externally located from the memory modules such as on a memory selection and timing module 48. In such an embodiment, memory array selection comparator 44a includes a plurality of preselected, unique memory module addresses. By comparing the plurality of unique memory module addresses with the plurality of memory address signals 46, memory array selection comparator 44a generates, at any one moment one column address select enable signal 42a based upon the comparator's detection of equivalence between one of the preselected, unique memory module addresses and the memory address signals 46 present at the given moment in time. Memory array selection comparators 44 and 44a may be implemented with discrete logic, with programmable array logic, or by equivalent means as is well known to those skilled in the art.

Row address select timing signals 30,32 as well as column address select timing signal 44 are provided by memory timing generator 50. In the preferred embodiment, memory timing generator 50 is located on, and associated with, memory module 12 and comparator 44. Memory timing generator 50 provides the row address select timing signals 30,32, and the column address select timing signal 40 in response to a memory cycle initiate signal 52 synchronized with clock signal 54.

In an alternative embodiment, memory timing generator 50a may be remotely located from memory module 12 such as on memory selection and timing module 48 as previously discussed with regard to memory array selection comparator 44a. In the embodiment where memory timing generator 50a is remotely located from the memory modules, the memory timing generator 50 generates timing signals 30a, 32a and 40a to each memory module in the system, in response to memory cycle initiate signal 52a synchronized with clock signal 54a.

Each additional memory module such as memory module 14 also includes an array of memory cells 20a, row address select and column address select signal generators 26a, 34a respectively, and, an associated memory array selection comparator 44b and memory timing generator 50b located on the memory module 14 or, as previously described, a remotely located memory array selection comparator 44a and memory timing generator 50a. Additionally, each memory module such as memory modules 12 and 14 include additional circuitry such as address and data latches, command latches and decoders, parity generation circuitry, and read/write control circuitry, all of which are well known to those skilled in the art and are omitted from this figure for the sake of clarity.

Figure 2:
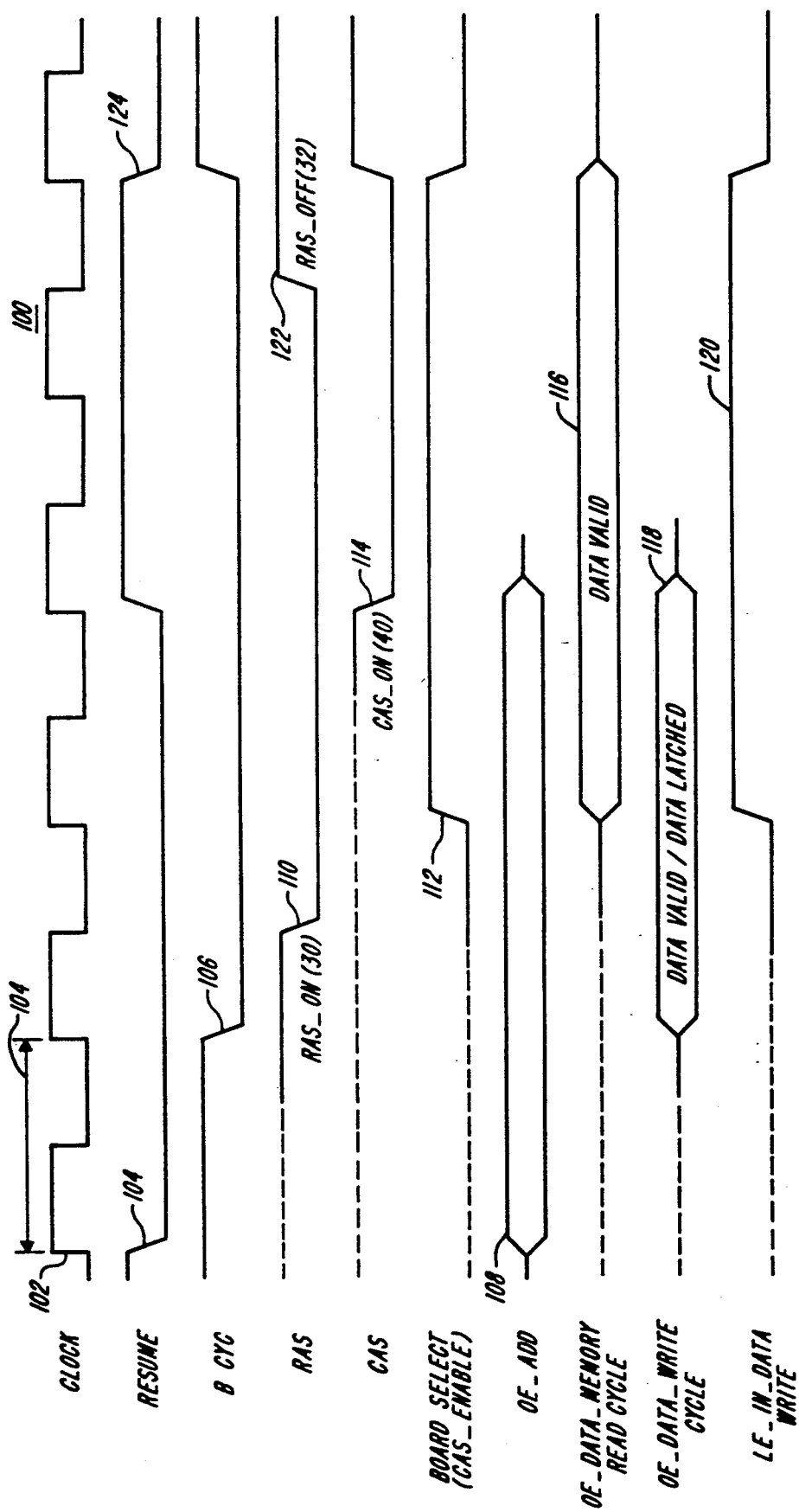
FIG. 2 is a timing diagram illustrating the memory timing signals generated for reducing memory access time in accordance with the present invention.

The system for generating memory timing signals and reducing memory access time according to the present invention may be better understood in conjunction with timing diagram 100, FIG. 2, wherein is shown clock signal 102 which in the preferred embodiment, is operating at approximately 24 MHz, and has a period 104 of approximately 42 nanoseconds.

Upon a memory access request, the requesting device will assert a resume signal as shown at 104. If the memory bus is not otherwise occupied, the bus controller, in response to assertion of the resume signal, will assert a memory initiate signal 106, also referred as the bus cycle signal approximately 1 clock cycle after the resume signal 104 is asserted. At approximately the same time as the requesting device asserts resume signal 104, the requesting device places a memory address on the memory address bus as shown at 108.

Traditional prior art systems would then use comparator circuitry localized on the memory modules or centralized and remotely located from the memory modules to decode the presented address 108 to determine on which memory module the requested data is to be read from or written to. Subsequently, the row address select signals followed by the column address select signals would be asserted. This timing scheme could take five or six clock periods to accomplish.

In contrast, the present invention features a system for generating memory timing and reducing memory access time wherein after approximately one half clock cycle after the memory initiate signal 106 has been asserted, the memory timing generator generates a row address select timing signal entitled RAS_on, 110, which causes each row address select signal generator on each memory module to generate at least one row address select signal to each array of memory cells located on each memory module. Approximately one clock cycle after the memory initiate signal 106 has been asserted, the memory array selection comparator circuitry has now had time to decode the memory address presented at 108 and asserts Board_select signal 112 also referred to as the CAS_enable signal. Subsequently, only one Board_select (Cas_enable) signal 112 is asserted and thus, only one column address select generator on one memory module will be enabled.

Approximately one clock cycle after the Board_select signal 112 is generated, the memory timing generator generates a column address select timing signal CAS_on, 114. Memory cells on memory modules which have not received the Board select (CAS_ enable) signal will treat the Ras_on signal merely as the beginning of a refresh cycle and no further action will be taken.

Those one or more memory cells which have been selected as a result of memory address signal decoding under control of row address select timing signal 110 and column address select timing signal 114 will have valid data which can be read from the memory cells as shown during time period 116, or may have valid data previously latched, 118, written to the one or more memory cells during time period 120. Subsequently, the memory timing generator deactivates row address select timing signal 110 as shown at time period 122 prior to the next request 124 for access to memory.

Figure 3:
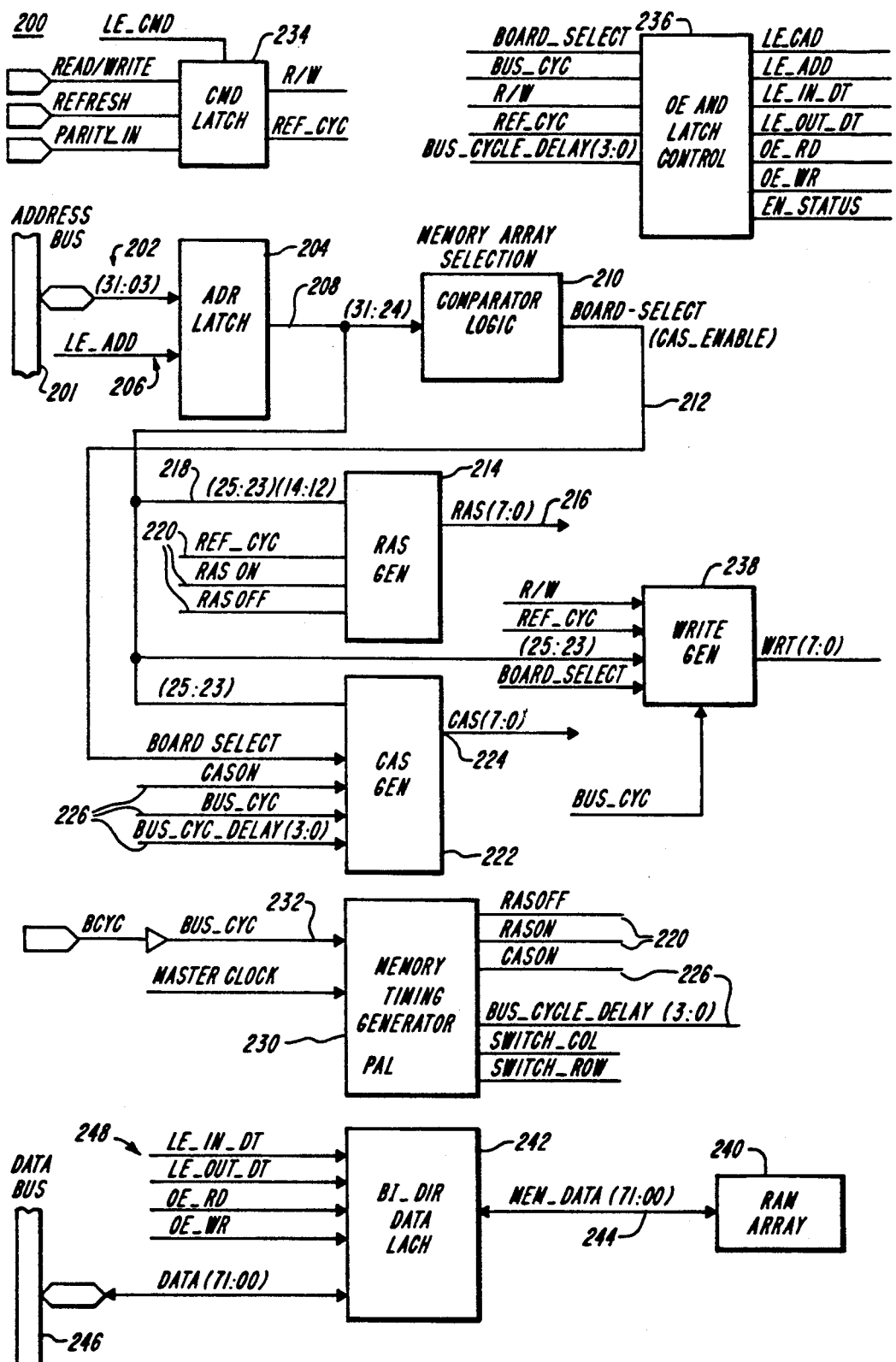
FIG. 3 is a more detailed block diagram of one embodiment of the present invention.

One embodiment of the system for generating memory timing and reducing memory access time according to the present invention and previously shown in FIG. 1 is shown in greater detail in FIG. 3 wherein is shown address bus 201 from which are directed a plurality of memory address signals 202 which are latched by address latch 204 under control of address latch enable 206. Latched memory addresses 208 from the plurality of memory addresses signals 202 are directed to memory array selection comparator logic 210 which generates the Board_select (CAS_enable) signal 212 upon the equivalence of the addresses on memory address lines 208 with the preselected, unique memory module address stored within memory array selection comparator 210.

Row address select signal generator 214 provides one or more row address select signals 216 in response to a selected plurality of memory address signals 218, and row address select timing signals 220. Column address select generator 222 provides one column address select signal 224 in response to column address select timing signals 226 and Board_select (CAS enable) signal 212.

Memory timing generator 230 is responsive to memory initiate signal (Bus_Cyc) 232 and master clock signal, for providing row address select timing signals 220, and column address select timing signals 226. Additional circuitry, as required, may be provided such as command latch circuitry 234; output enable latch control circuitry 236; and memory write control circuitry 238.

Memory array 240 is coupled to a bi-directional data latch 242 by means of a memory module data bus 244. The data latch 242 then provides the data to memory data bus 246 which is coupled to other memory modules, and may be coupled to other devices such as a controller, a host system, or the requesting device, under control of bi-directional data latch control signals 248.

Modifications and substitutions to the present invention by one of ordinary skill in the art is considered to be within the scope of the present invention, which is not to be limited except by the claims which follow.

We claim:

1. A system for generating memory timing signals and for reducing memory access time, comprising:

means for providing memory addresses, each memory address including at least a memory array address portion, a row address portion, and a column address portion;

a plurality of memory modules, each memory module having a unique memory module address, said modules responsive to a memory array address portion of a provided memory address which corresponds to said unique memory module address, each of said memory modules including an array of memory cells operative for storing data, each memory cell addressable in response to at least one row address select signal and at least one column address select signal;

each memory module further including:

an associated row address select signal generator, responsive to said row address portion of each of said provided memory addresses and to at least one row address select timing signal, each row address select signal generator for providing said at least one row address select signal to each of said array of memory cells on said associated memory module; and an associated column address select signal generator, responsive to said column address portion of each of said provided memory addresses, to at least one column address select timing signal, and to a column address select signal generator enable signal, for decoding said column address portion of each of said provided memory addresses while each of said row address signal generators is providing said at least one row address select signal to each of said arrays of memory cells, and for providing said at least one column address select signal to a selected column of said array of memory cells within one selected memory module;

at least one memory array selection comparator associated with each of said memory modules, for comparing said memory array address portion of a provided memory address with said unique memory module address while each of said row address signal generators is providing said at least one row address select signal to each of said arrays of memory cells, and for identifying said one selected memory module from among said plurality of memory modules, and for providing said column address select signal generator enable signal to one column address select signal generator associated with the one selected memory module upon the equivalence of said memory array address portion of said provided memory address and said unique memory module address; and at least one memory timing generator associated with each of said memory modules, responsive to at least one memory cycle initiate signal and to a clock signal, for sequentially providing said row address select timing signal and said column address select timing signal, said row address select timing signal from each memory timing generator associated with each of said memory modules operative for enabling each row address select signal generator associated with each of said plurality of memory modules to generate a row address select signal to each memory module prior to the time that the memory array selection comparator associated with the one selected memory module identifies the selected one memory module and provides said column address select signal generator enable signal to enable only the one column address select signal generator associated with the one selected memory module, thereby enabling only said one column address select signal generator associated with said one selected memory module, said one column address select signal generator subsequently providing said at least one column address select signal to said selected column of memory cells of said one selected memory module.

2. The system of claim 1 wherein said system includes one memory timing generator which provides said row address select timing signal and said column address select timing signal to each and every row address select signal generator and column address select signal generator.

3. The system of claim 1 wherein each of said plurality of memory modules includes an associated memory array selection comparator and memory timing generator disposed on each of said plurality of memory modules.

4. The system of claim 1 wherein each of said plurality of memory modules includes an array of dynamic random access memory cells.

* * * * *